(12) United States Patent
Gordon et al.

(10) Patent No.: US 6,911,283 B1
(45) Date of Patent: Jun. 28, 2005

(54) METHOD AND APPARATUS FOR COUPLING A PELLICLE TO A PHOTOMASK USING A NON-DISTORTING MECHANISM

(75) Inventors: Joseph Stephen Gordon, Gardiner, NY (US); Gregory P. Hughes, Austin, TX (US); Franklin Dean Kalk, Austin, TX (US); Hakki Ufuk Alpay, Poughquag, NY (US); Glenn E. Storm, Ridgefield, CT (US)

(73) Assignee: DuPont Photomasks, Inc., Round Rock, TX (US)

( * ) Notice: Subject to any disclaimer, the term of this patent is extended or adjusted under 35 U.S.C. 154(b) by 293 days.

(21) Appl. No.: 10/072,204

(22) Filed: Feb. 7, 2002

Related U.S. Application Data

(60) Provisional application No. 60/267,286, filed on Feb. 7, 2001.

(51) Int. Cl.[7] .............................. G03F 9/00; G03B 27/62
(52) U.S. Cl. ............................... 430/5; 428/14; 355/75
(58) Field of Search ............................ 430/5; 428/14; 355/75

(56) References Cited

U.S. PATENT DOCUMENTS

| | | | |
|---|---|---|---|
| 4,637,713 A | 1/1987 | Shulenberger et al. | 355/76 |
| 5,616,927 A | 4/1997 | Kubota et al. | 250/492.2 |
| 5,693,382 A | 12/1997 | Hamada et al. | 428/14 |
| 5,723,860 A | 3/1998 | Hamada et al. | 250/239 |
| 5,769,984 A | 6/1998 | Yen et al. | 156/73.1 |
| 5,772,817 A | 6/1998 | Yen et al. | 156/73.1 |
| 5,772,842 A | 6/1998 | Tanaka et al. | 156/584 |
| 5,976,307 A | 11/1999 | Cook, Jr. | 156/344 |
| 6,103,427 A | 8/2000 | Storm | 430/5 |
| 6,264,773 B1 | 7/2001 | Cerio | 156/64 |

*Primary Examiner*—Mark F. Huff
*Assistant Examiner*—Saleha Mohamedulla
(74) *Attorney, Agent, or Firm*—Baker Botts L.L.P.

(57) ABSTRACT

A method and apparatus for coupling a pellicle to a photomask using a non-distorting mechanism are disclosed. A pellicle is coupled to a photomask with a non-distorting mechanism that is located on a pellicle frame opposite a thin film coupled to the pellicle frame. The non-distorting mechanism acts to reduce stress exerted on the photomask by the pellicle.

32 Claims, 2 Drawing Sheets

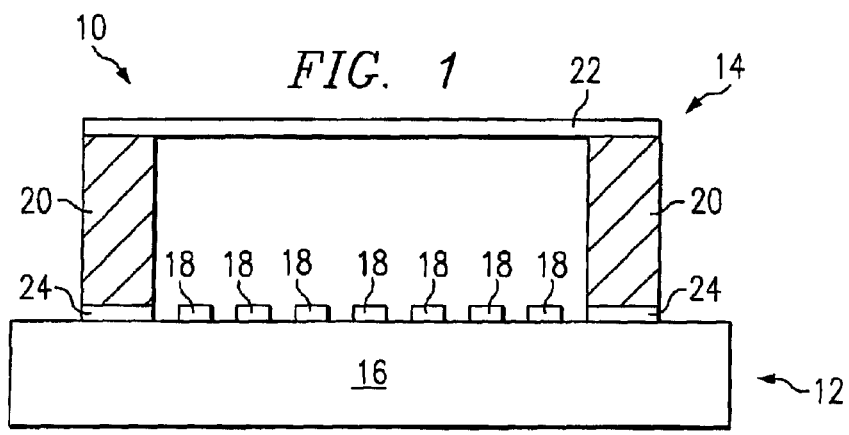
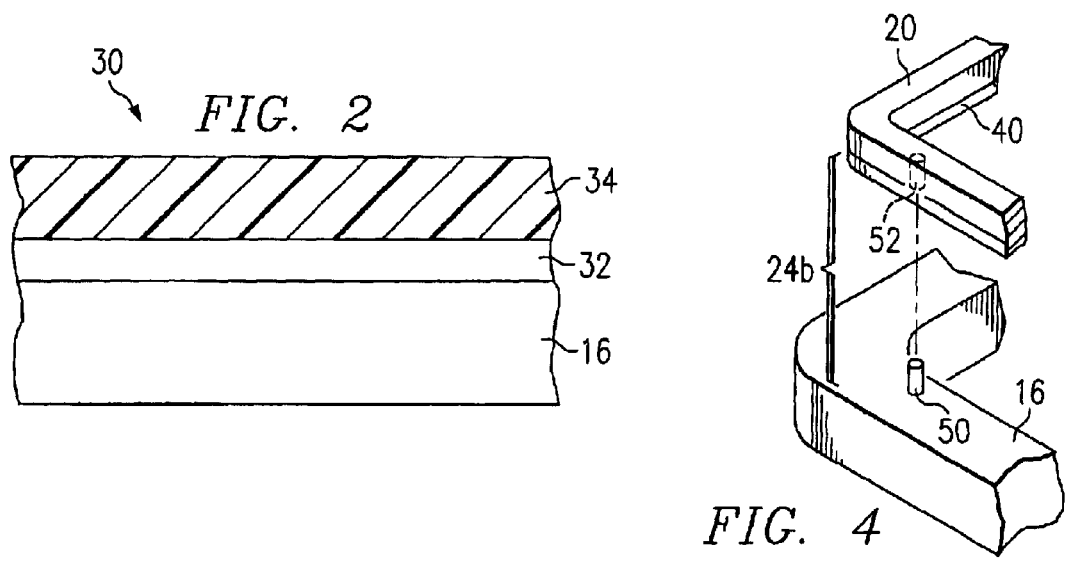
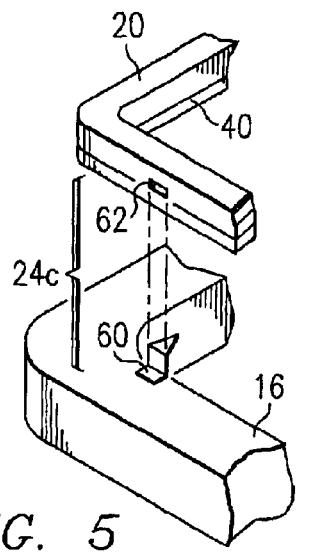
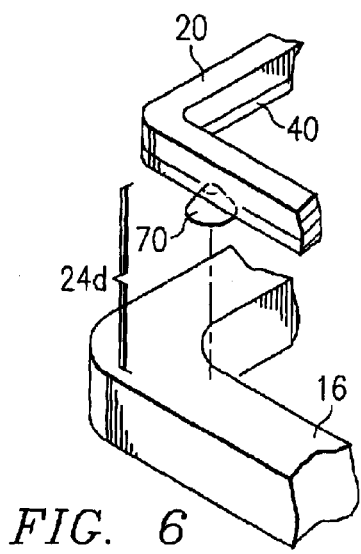

METHOD AND APPARATUS FOR COUPLING A PELLICLE TO A PHOTOMASK USING A NON-DISTORTING MECHANISM

CROSS-REFERENCE TO RELATED APPLICATIONS

This application claims priority from U.S. Provisional Patent Application Ser. No. 60/267,286, filed Feb. 7, 2001 by Joseph S. Gordon et al., and entitled "Advanced Photomask Assembly."

TECHNICAL FIELD OF THE INVENTION

This invention relates in general to the field of lithography and, more particularly, to a method and apparatus for coupling a pellicle to a photomask using a non-distorting mechanism.

BACKGROUND OF THE INVENTION

As semiconductor manufacturers move toward fabricating smaller features on a wafer, a photomask assembly that is used to project the features onto the wafer has become increasingly important. For example, features on the wafer are becoming smaller than the wavelength of light used to print the features. At shorter wavelengths, the light in a photolithography system has more energy and can be destructive to a photomask assembly manufactured with conventional materials.

A conventional photomask assembly generally includes a photomask, also known as a reticle or mask, and at least one pellicle that covers the patterned side of the photomask. A standard photomask includes a patterned layer of opaque or partially transmissive material formed on a transparent substrate. A pellicle typically includes a thin film attached to a frame. The thin film acts as a cover that keeps contaminants off the surface of the photomask during a lithography process. The height of the frame corresponds to a distance from the surface of the photomask such that when a contaminant lands on the thin film, it is out of focus and is not imaged onto the wafer. The pellicle frame is typically mounted on the photomask with an annular shaped adhesive gasket that is attached to the bottom and around the perimeter of the pellicle frame. The gasket is typically made of an adhesive material and functions as an attachment device as well as a seal.

At exposure wavelengths in the deep ultra violet (DUV), vacuum ultraviolet (VUV) and extreme ultraviolet (EUV) ranges, various characteristics of the photomask assembly are of concern. For example, the flatness of a photomask becomes more critical as the exposure wavelength decreases. Existing pellicle application techniques use pressure to create an adhesive bond between the pellicle frame, the gasket and the transparent substrate. During mounting, a pressure is applied to the pellicle in order to create a seal between the pellicle and the photomask. The pressure distorts both the pellicle frame and the photomask substrate. When the pressure is removed, the pellicle frame attempts to return to its original shape, which may cause photomask distortion. The photomask assembly eventually reaches an equilibrium, but the frame and photomask remain in a stressed state. Over time, the stress may cause the flatness of the photomask to degrade and cause registration errors on the wafer. Flatness may also be affected by an inherent stress that is present in a material that is deposited on the transparent substrate and used to create the patterned layer. This stress, in addition to any stress caused by the pellicle, may eventually warp the photomask and cause registration errors during a lithography process.

Furthermore, conventional adhesive materials used for the gasket may embrittle and outgas with prolonged exposure to electromagnetic energy with wavelengths below approximately 250 nanometers (nm). The outgassing may cause the seal provided by the gasket to degrade. If the seal is broken, contaminants in the lithography system may reach the surface of the photomask and cause defects to appear on the wafer.

The materials used to form the various parts of the photomask assembly are also critical in lithography systems that use exposure wavelengths of less than approximately 250 nm. For example, a pellicle film made of nitrocellulose can degrade and therefore, cause the photomask to be contaminated during the lithography process.

SUMMARY OF THE INVENTION

In accordance with teachings of the present invention, the disadvantages and problems associated with coupling a pellicle to a photomask using a non-distorting mechanism have been substantially reduced or eliminated. In a particular embodiment, a method for attaching a pellicle to a photomask is disclosed that includes coupling a pellicle to a photomask using a non-distorting mechanism that reduces stress exerted on the photomask by the pellicle.

In accordance with one embodiment of the present invention, a method for attaching a pellicle to a photomask includes providing a pellicle that has a thin film coupled to a first end of the frame. The frame includes a non-distorting mechanism coupled to a second end of the frame that is located opposite the thin film. The pellicle is coupled to the frame using the non-distorting mechanism that reduces stress exerted on the photomask by the pellicle.

In accordance with another embodiment of the present invention, a pellicle includes a frame that has a first end located opposites a second end. A transparent thin film is coupled to the first end of the frame. A non-distorting mechanism is coupled to the second end of the frame. The non-distorting mechanism couples the pellicle to a photomask and reduces stress exerted on the photomask by the pellicle.

In accordance with a further embodiment of the present invention, a photomask assembly includes a photomask and a pellicle. The photomask includes a patterned layer formed on a substrate and the pellicle includes a thin film attached to a frame. The frame is coupled to the substrate by a non-distorting mechanism that reduces stress exerted on the photomask by the pellicle.

Important technical advantages of certain embodiments of the present invention include a non-distorting coupling mechanism that reduces or prevents degradation of a flatness associated with a photomask. The non-distorting coupling mechanism includes an attachment mechanism that is separate from a sealing mechanism. The attachment mechanism couples the pellicle to the photomask without the need to use a large amount of force. Once the pellicle is attached to the photomask, the sealing mechanism may use a non-adhesive material to provide a substantially hermetic seal between a pellicle and the photomask. Since the force required to mount and seal the pellicle on the photomask is substantially reduced, the amount of stress applied during assembly of the pellicle and the photomask may also be reduced. The reduced amount of stress, therefore, reduces or eliminates changes in flatness of the photomask over time.

Another important technical advantage of certain embodiments of the present invention includes a non-distorting coupling mechanism that reduces or eliminates registration errors that may occur during a semiconductor manufacturing process. Typically, registration errors may occur because the photomask is warped or the flatness has degraded over time. At exposure wavelengths below approximately 250 nanometers, the flatness of the photomask is critical since a small difference in the flatness across the photomask may cause a proportionally large registration error on a wafer. A non-distorting coupling mechanism formed in accordance with the teachings of the present invention reduces stress that can cause the flatness to degrade and therefore, reduces the number of registration errors that may occur.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete understanding of the present invention and advantages thereof may be acquired by referring to the following descriptions taken in conjunction with the accompanying drawings, in which like reference numbers indicate like features, and wherein:

FIG. 1 illustrates a cross-sectional view of a photomask assembly that includes a non-distorting mechanism for coupling a pellicle to a photomask in accordance with the teachings of the present invention;

FIG. 2 illustrates a cross-sectional view of a photomask blank that is used to create a photomask in accordance with the teachings of the present invention;

FIG. 4 illustrates a schematic drawing with portions broken away showing a perspective view of a portion of a photomask assembly that includes another embodiment of a non-distorting mechanism in accordance with the teachings of the present invention;

FIG. 5 illustrates a schematic drawing with portions broken away showing a perspective view of a portion of a photomask assembly that includes a further embodiment of a non-distorting mechanism in accordance with the teachings of the present invention; and FIG. 6 illustrates a schematic drawing with portions broken away showing a perspective view of a portion of a photomask assembly that includes an additional embodiment of a non-distorting mechanism in accordance with the teachings of the present invention.

DETAILED DESCRIPTION OF THE INVENTION

Figure 3:
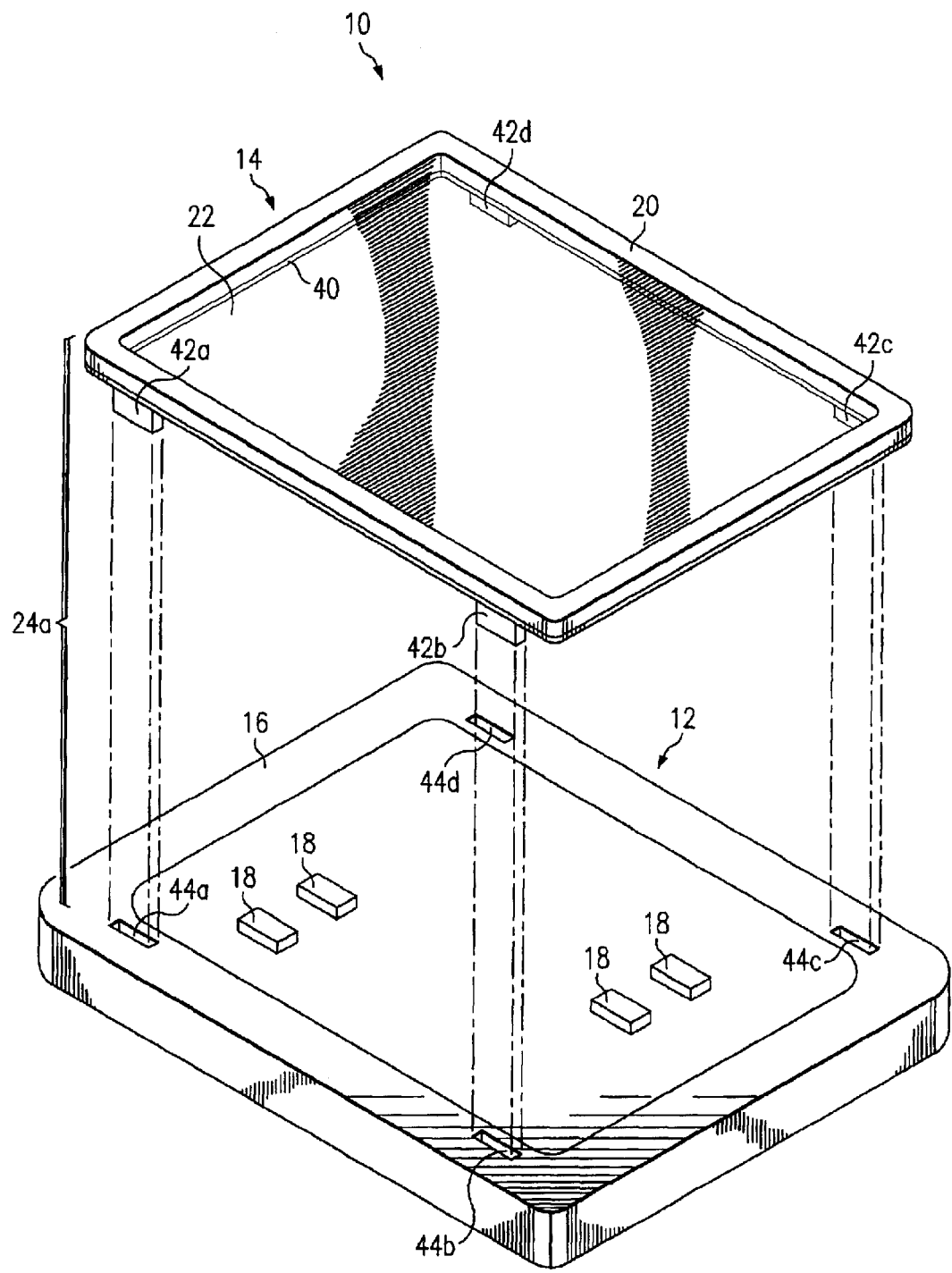
FIG. 3 illustrates a perspective view of a photomask assembly that includes one embodiment of a non-distorting mechanism in accordance with the teachings of the present invention.

Preferred embodiments of the present invention and their advantages are best understood by references to FIGS. 1 through 6, where like numbers are used to indicate like and corresponding parts.

FIG. 1 illustrates a cross-sectional view of photomask assembly 10. Photomask assembly 10 includes photomask 12 coupled to pellicle 14 by non-distorting mechanism 24. In a particular embodiment, non-distorting mechanism 24 provides an attachment mechanism for mounting pellicle 14 on photomask 12 and a sealing mechanism for creating a seal between pellicle 14 and photomask 12 once pellicle 14 has been mounted on photomask 12. The attachment and sealing mechanisms reduce stress that may be exerted by pellicle 14 on photomask 12.

Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits approximately ninety-nine percent of incident light having a wavelength between approximately 10 nanometers (nm) and approximately 450 nm. Substrate 16 may also have the characteristics listed in Table 1.

TABLE 1

| Substrate Characteristics | |
|---|---|
| Characteristics | Typical Requirements: |
| Transmission | >90% at exposure wavelength |
| Optical Durability | After $10^6$ exposure cycles >90% Transmission at exposure wavelength |
| Physical durability | Able to withstand (without defects) multiple cleaning cycles including, ultrasonic, megasonic, brush, proximity scrubbing and other suitable cleaning techniques |
| Chemical Durability | Able to withstand (without defects) multiple cleaning cycles |
| Flatness | Maintains flatness <2.0 um across the mask field to be projected on a wafer |

In an alternative embodiment, substrate 16 may be a reflective material such as silicon or any other suitable material that reflects greater than approximately fifty percent of incident light having a wavelength between approximately 10 nm and 450 nm.

Patterned layer 18 may be a metal material such as chrome, chromium nitride, a metallic oxy-carbo-nitride (M—O—C—N), where the metal is selected from the group consisting of chromium, cobalt, iron, zinc, molybdenum, niobium, tantalum, titanium, tungsten, aluminum, magnesium and silicon, and any other suitable material that absorbs electromagnetic energy with wavelengths in the ultraviolet (UV) range, deep ultraviolet (DUV) range, vacuum ultraviolet (VUV) range and extreme ultraviolet range (EUV). In an alternative embodiment, patterned layer 18 may be a partially transmissive material, such as molybdenum silicide (MoSi), which has a transmissivity of approximately one percent to approximately thirty percent in the UV, DUV, VUV or EUV ranges.

Frame 20, pellicle film 22 and non-distorting mechanism 24 form pellicle 14. Frame 20 is typically formed of anodized aluminum, although it could alternatively be formed of stainless steel, plastic or other suitable materials. Frame 20 may further have the characteristics listed in Table 2.

TABLE 2

Pellicle Frame Characteristics

| Characteristics | Typical Requirements: |
|---|---|
| Exposure durability | After $10^6$ exposure cycle no outgassing defects, loss of adhesion or particulate generation |
| Chemical Durability | Able to withstand prolonged exposure to ozone generated in lithography process |
| Outgassing | No outgassing of materials which can cause defects on photomask surface over exposure lifetime |

Pellicle film 22 may be a thin film membrane formed of a material such as nitrocellulose, cellulose acetate, an amorphous fluoropolymer, such as Teflon® AF manufactured by E. I. du Pont de Nemours and Company or Cytop® manufactured by Asahi Glass, a poly-phosphazene polymer, such as a nitrogen-phosphorus based polymer, or another suitable film that is transparent to wavelengths in the UV, DUV, VUV and EUV ranges. Pellicle film 22 may be prepared by a conventional technique such as spin casting and have the characteristics listed in Table 3.

TABLE 3

Pellicle film Characteristics

| Characteristics | Typical Requirements: |
|---|---|
| Transmission | >97% at exposure wavelength |
| Optical Durability | 300 Joules at exposure wavelength with less than 2% transmission drop 100 Joules at 172 nm cleaning wavelength with less than 2% transmission loss |
| Physical durability | Able to withstand 30 Psi air blow from 1 mm nozzle at 1" for cleaning |
| Outgassing | No outgassing of materials which cause defects on reticle surface over exposure lifetime |
| Thickness Uniformity | >1/20 of wavelength of exposure light |

Pellicle film 22 may further have a thickness that is tuned to produce a transmission maxima at or near the exposure wavelength in a lithography system. In one embodiment, the transmission characteristics may be obtained by making the optical thickness of pellicle film 22 an even multiple of the design wavelength.

In another embodiment, pellicle film 22 may be any amorphous vinyl homopolymer or copolymer that exhibits an absorbance per micron ($A/\mu m$) of less than approximately one at wavelengths of less than approximately 200 nm. In particular, pellicle film 22 may be an amorphous vinyl homopolymer of perfluoro-2,2-dimethyl-1,3-dioxole and $CX_2=CY_2$, where X is fluorine (F), carbon fluoride ($CF_3$) or carbon hydride ($CH_3$) and Y is hydrogen (H) or chlorine (Cl), or an amorphous vinyl copolymer of perfluoro-2,2-dimethyl-1,3-dioxole and $CX_2=CY_2$. The homopolymers or copolymers may also contain 0 to 25 mole percent of one or more monomers $CR^aR^b=CR^cR^d$ where the monomer enters the homopolymer or copolymer in approximately random fashion and optionally 40 to 60 mole percent of one or more monomers $CR^aR^b=CR^cR^d$ where the monomer enters the homopolymer or copolymer in approximately alternating fashion, where each of $R^a$, $R^b$ and $R^c$ is selected independently from H or F and where $R^d$ is selected from the group consisting of H, F, $-CF_3$, $-OCH_3$, $-OC(CH_3)_3$, $-OCH_2C(CH_3)_3$, $-Si(OCH_3)_3$, and Cl. Additional copolymer compositions may include poly(hexafluoroisobutylene: trifluoroethylene) with 40–60 mole percent hexafluoroisobutylene and 60–40 mole percent trifluoroethylene and copolymer compositions including poly(hexafluoroisobutylene: vinyl fluoride) with 40–60 mole percent hexafluoroisobutylene and 60–40 mole percent vinyl fluoride.

Pellicle film 22 may be attached to frame 20 by an appropriate adhesive material that does not outgas and maintains its adhesive characteristics during exposure in a lithography system. Pellicle film 22 may also have the additional characteristics listed in Table 4.

TABLE 4

Pellicle Film to Frame Adhesive Characteristics

| Characteristics | Typical Requirements: |
|---|---|
| Optical Durability | After $10^6$ exposure cycle >90% Transmission at exposure wavelength |
| Exposure durability | After $10^6$ exposure cycle no outgassing defects, loss of adhesion or particulate generation |
| Chemical Durability | Able to withstand prolonged exposure to ozone generated in lithography process |
| Outgassing | No outgassing of materials which cause defects on photomask surface over exposure lifetime |
| Strength | Withstand 30 PSI airblow at film frame interface |

Pellicle film 22 protects photomask 12 from contaminants, such as dust particles, by ensuring that the contaminants remain a defined distance away from photomask 12. This may be especially important in a lithography system. During lithography, photomask assembly 10 is exposed to electromagnetic energy produced by an energy source within the photolithography system. The electromagnetic energy may include light of various wavelengths, such as wavelengths approximately between the I-line and G-line of a Mercury arc lamp, DUV, VUV or EUV radiant energy, or X-rays. Pellicle film 22 is designed to allow a large percentage of the electromagnetic energy to pass through it. Dust particles collected on pellicle film 22 will likely be out of focus at the surface of the wafer being processed and the exposed image on the wafer should be clear. Pellicle film 22 formed in accordance with the teachings of the present invention may be satisfactorily used with all types of electromagnetic energy and is not limited to lightwaves as described in this application.

Non-distorting mechanism 24 functions to couple pellicle 14 to photomask 12 without introducing a stress on photomask 12 that may be created by pellicle 14 during a mounting process. In one embodiment, non-distorting mechanism 24 reduces a stress created on photomask 12 by pellicle 14 by providing a technique to separately attach and seal pellicle 14 to photomask 12. For example, non-distorting mechanism 24 may include an attachment mechanism and a sealing mechanism. The attachment mechanism may mount pellicle 14 on photomask 12 without the use of pressure. The sealing mechanism may then form a seal between pellicle 14 and photomask 12. The seal may be formed with little or no pressure since pellicle 14 has already been mounted on photomask 12 by the attachment mechanism. Furthermore, non-distorting mechanism 24 may reduce the degradation of a flatness associated with photomask 12 since the overall stress in photomask assembly 10 is reduced. Stress in the system is typically caused by pressure applied to pellicle 14 when pellicle 14 is mounted on photomask 12. Since the attachment and sealing mechanisms provide a way of coupling pellicle 14 to photomask 12 without the use of a large amount of pressure, the amount of stress present in photomask assembly 10 is reduced and the flatness of photomask 12 may be maintained.

FIG. 2 illustrates a cross-sectional view of photomask blank 30 that may be used to create photomask 12. Photomask blank 30 includes substrate 16, material layer 32 and resist layer 34. Material layer 32 may be deposited on substrate 16 using physical vapor deposition (PVD), chemical vapor deposition (CVD), ion beam deposition (IBD) or any other suitable deposition technique. Material layer 32 may be formed from an opaque or partially transmissive material, such as the materials described in referenced to patterned layer 18 in FIG. 1, and may have the characteristics listed in Table 5.

TABLE 5

Absorber Characteristics

| Characteristics | Typical Requirements: |
|---|---|
| Transmission | 0.001 to 12% at exposure wavelength |
| Reflectivity | <20% at exposure wavelength |
| Optical Durability | After $10^6$ exposure cycle >90% Transmission at exposure wavelength |
| Physical durability | Able to withstand (without defects) multiple cleaning cycles including, ultrasonic, megasonic, brush, proximity scrubbing and other suitable cleaning techniques |
| Chemical Durability | Able to withstand (without defects) multiple cleaning cycles |
| Stress | Flatness distortion caused by the intrinsic stress of the absorber should be <0.5 um across the mask field projected on to a wafer |

In an alternative embodiment, material layer 32 may be formed from a reflective material that reflects greater than approximately fifty percent of incident light in the UV, DUV, VUV and EUV ranges. The reflective material may also have the characteristics listed in Table 6.

TABLE 6

Reflector Characteristics

| Characteristics | Typical Requirements: |
|---|---|
| Transmission | 0.01% to 0.5% at exposure wavelength |
| Reflectivity | <20% at exposure wavelength |
| Optical Durability | After $10^6$ exposure cycle >90% Transmission at exposure wavelength |
| Physical durability | Able to withstand (without defects) multiple cleaning cycles including, ultrasonic, megasonic, brush, proximity scrubbing and other typical suitable cleaning techniques |
| Chemical Durability | Able to withstand (without defects) multiple cleaning cycles |
| Stress | Flatness distortion caused by the intrinsic stress of the reflector should be <0.5 um across the mask field projected on to a wafer. |

In addition to the stress created by pellicle 14, material layer 32 may contain an intrinsic stress that causes registration errors due to a change in flatness of photomask 12. When material layer 32 is deposited, a stress is exerted on substrate 16 that may cause the flatness of substrate 16 to degrade. Therefore, by reducing the stress associated with material layer 32, registration errors that can occur during a semiconductor manufacturing process using photomask 12 may be reduced or even eliminated.

Photomask 12 may be formed from photomask blank 30 using a standard lithography process. In the lithography process, a mask pattern file that includes data for patterned layer 18 may be generated from a circuit design pattern and the desired pattern may be imaged into resist layer 34 of photomask blank 30 using a laser, electron beam or X-ray lithography tool. In one embodiment, a laser lithography tool uses an Argon-Ion laser that emits light having a wavelength of approximately 364 nanometers (nm). In alternative embodiments, the laser lithography tool uses lasers emitting light at wavelengths from approximately 150 nm to approximately 300 nm. Photomask 12 may be fabricated by developing the exposed areas of resist layer 34 to create a pattern, etching portions of material layer 32 patterned not covered by resist to form patterned layer 18, and removing the undeveloped resist to create patterned layer 18 over transparent substrate 16.

In one embodiment, resist layer 34 is a positive photoresist, such as 895I resist manufactured by Arch Chemicals, and the exposed areas are dissolved in a developer to expose regions of material layer 32 formed on substrate 16. In an alternative embodiment, resist layer 34 is a negative photoresist and the unexposed areas are dissolved in a developer to expose regions of material layer 32 formed on substrate 16. Resist layer 34 may be formed on material layer 32 by spin casting to create a thickness tuned to provide the optimum critical dimension control during a patterning process. This thickness tuning process may take into consideration the reflectivity of material layer 32 at the exposure wavelength of a lithography system in order to provide stability in the exposure and developing processes.

FIG. 3 illustrates a perspective view of photomask assembly 10 that includes one embodiment of non-distorting mechanism 24a. Non-distorting mechanism 24a may include a sealing mechanism and an attachment mechanism. In the illustrated embodiment, the sealing mechanism includes gasket 40 that is formed around an inner portion of the bottom surface of frame 20. Gasket 40 may be made of a non-adhesive material, such as, but not limited to, a non-degrading fluoropolymer, silicon, or polyphosphazene based material or any other suitable material that provides a seal between photomask 12 and pellicle 14 without having to apply a large amount of force. The material used to form gasket 40 may also have the characteristics listed in Table 7.

TABLE 7

Pellicle Gasket

| Characteristics | Typical Requirements: |
|---|---|
| Exposure durability | After $10^6$ exposure cycle no outgassing defects, loss of adhesion or particulate generation |
| Physical durability | Able to withstand shocks of 10 G without loss of adhesion |
| Chemical Durability | Able to withstand prolonged exposure to ozone generated in lithography process |
| Outgassing | No outgassing of materials which cause defects on reticle surface over exposure lifetime |

In a particular embodiment, the fluoropolymers described above in reference to pellicle film 22 may be used as gasket 40. Gasket 40 preferably maintains a hermetic seal and provides a substantially degradation free seal on the inner perimeter of frame 20 without the need to apply a force to pellicle 14 to create the seal.

In another embodiment, gasket 40 may be any type of non-degrading gel material that conforms to the surface of substrate 16 without the use of a significant amount of force. For example, the gel material may be silicone, a siloxane based material or any other suitable material that can provide a non-degrading seal when exposed to light in the UV, DUV, VUV or EUV ranges. Typically, the gel material is highly resilient and conforms to many different shapes and structures. Since the force needed to attach frame 20 to substrate 16 would not be needed or would be greatly reduced by using the gel material, photomask 12 may not be significantly distorted during mounting of pellicle 14. The lower amount of distortion may also reduce the amount of stress introduced into photomask assembly 10 by pellicle 14 and reduce the amount of degradation of the flatness of substrate 16 over time. Since the gel material also conforms to the shape of frame 20, the hermetic seal between photomask 12 and pellicle 14 prevents contaminants from being introduced into photomask assembly 10.

At wavelengths in the DUV range or below, the atmosphere between photomask 12 and pellicle 14 must be free of oxygen and other gases which can absorb these wavelengths. Removal of oxygen may be accomplished by an active venting system that includes openings (not expressly shown) in the wall of frame 20, which allow gas to escape and enter the space between pellicle 14 and photomask 12. A mixture of pure nitrogen or other inert transmitive gases may be introduced into the space in order to keep oxygen from being reintroduced.

In the embodiment illustrated in FIG. 3, the attachment mechanism includes the combination of magnets 42a through 42d and magnetic sections 44a through 44d. Although magnets 42 and magnetic sections 44 are shown as being located on the corners of frame 20 and the corners of the mask field of photomask 12, respectively, magnets 42 may be located at any appropriate place on frame 20 and magnetic sections 44 may be located at any appropriate place on substrate 16. Furthermore, the number of magnets 42 and magnetic sections 44 may be any suitable number that allows pellicle 14 to be sufficiently attached to photomask 12.

Magnetic sections 44 may be any type of magnetic material that attracts magnets 42 and may be attached to substrate 16 with an inert epoxy, a gasket material, such as the materials described above in reference to gasket 40, or any other non-degrading material that will not contaminate photomask assembly 10 when exposed to wavelengths in the UV, DUV, VUV or EUV ranges. Magnets 42 may be elastically attached to frame 20 to reduce the stress on photomask 12 caused by pellicle 14.

Magnets 42 and magnetic sections 44 may be respectively coupled together to mount pellicle 14 on photomask 12. For example, magnets 42 may be aligned with magnetic sections 44 such that the respective magnets and magnetic sections (e.g., magnet 42a and magnetic section 44a, magnet 42b and magnetic section 44b, etc.) are aligned. When pellicle 14 is mounted on photomask 12 using magnets 42 and magnetic sections 44, gasket 40 comes in contact with substrate 16 and creates a seal between pellicle 14 and photomask 12. Since gasket 40 is non-adhesive, there is no stress caused by the seal. Furthermore, the combination of magnets 42 and magnetic sections 44 allow pellicle 14 to slide on the surface of photomask 12, which further reduces the amount of stress caused by pellicle 14. The reduced amount of stress may also reduce the degradation of the flatness of substrate 16 and therefore, reduce the number of registration errors on a wafer in a semiconductor manufacturing process.

FIG. 4 illustrates a schematic drawing with portions broken away showing a perspective view of a portion of photomask assembly 10 that includes another embodiment of non-distorting mechanism 24b. Non-distorting mechanism 24b may include a sealing mechanism and an attachment mechanism. In the illustrated embodiment, the sealing mechanism may be provided by gasket 40 (shown and described in FIG. 3) and the attachment mechanism may be pin 50 and slot 52 formed in frame 20. Pin 50 may be attached to substrate 16 with an inert epoxy, a gasket material, such as the materials described above in reference to gasket 40, or any other non-degrading material that will not contaminate photomask assembly 10 when exposed to wavelengths in the UV, DUV, VUV and EUV ranges.

Frame 20 may be mounted on substrate 16 by placing pin 50 in slot 52 and using a friction fit joiner (not expressly shown) located in slot 52 or on top of frame 20 to secure pin 50 in slot 52. Similar to magnets 42 and magnetic sections 44 illustrated in FIG. 3, pin 50 and slot 52 reduce the stress on photomask 12 that is caused by pellicle 14 by allowing pellicle 14 to slide on the surface of photomask 12. Also similar to magnets 42 and magnetic sections 44, pin 50 may be located at the four corners of the mask field on photomask 12 and slot 52 may be located at the four corners of frame 20. In other embodiments, a greater or lesser number of pins and slots may be located at any appropriate positions on photomask 12 and frame 20 respectively.

FIG. 5 illustrates a schematic drawing with portions broken away showing a perspective view of a portion of photomask assembly 10 that includes a further embodiment of non-distorting mechanism 24c. Non-distorting mechanism 24c may include a sealing mechanism and an attachment mechanism. In the illustrated embodiment, the sealing mechanism may be provided by gasket 40 (shown and described in FIG. 3) and the attachment mechanism may be clip 60 and attachment point 62 formed in frame 20. Clip 60 may be attached to substrate 16 with an inert epoxy, a gasket material, such as the materials described above in reference to gasket 40, or any other non-degrading material that will not contaminate photomask assembly 10 when exposed to wavelengths in the UV, DUV, VUV and EUV ranges.

Frame 20 may be mounted on substrate 16 by placing the end of clip 60 opposite substrate 60 into attachment point 62. In one embodiment, attachment point 62 may be located on the outside perimeter of frame 20 in the four corners and clips 60 may be coupled to substrate 16 at the four corners of the mask field of photomask 12 that correspond to the placement of attachment point 62 on frame 20. In alternative embodiments, a greater or lesser number of clips and corresponding attachment points may be located at any appropriate positions respectively on substrate 16 and frame 20. The combination of clip 60 and attachment point 62 reduce the stress on photomask 12 that is caused by pellicle 14 by allowing pellicle 14 to slide on the surface of photomask 12.

FIG. 6 illustrates a schematic drawing with portions broken away showing a perspective view of a portion of photomask assembly 10 that includes an additional embodiment of non-distorting mechanism 24d. Non-distorting mechanism 24d may include a sealing mechanism and an attachment mechanism. In the illustrated embodiment, the sealing mechanism may be provided by gasket 40 (shown and described in FIG. 3) and the attachment mechanism may be vacuum cup 70. Vacuum cup 70 may be located on the bottom surface of frame 20 and formed of a resilient gasket material, such as the materials described above in reference to gasket 40, or any other non-degrading material that will not contaminate photomask assembly 10 when exposed to wavelengths in the UV, DUV, VUV and EUV ranges.

Frame 20 may be mounted on substrate 16 by placing vacuum cup 70 on the surface of substrate 16 and applying a small force. Once vacuum cup 70 is in contact with substrate 16, vacuum cup elastically pulls itself back into place to create a vacuum. Since vacuum cup 70 may be applied to the surface of substrate 16 without the use of epoxy or any other adhesive material, photomask 12 and pellicle 14 may be reused if pellicle 14 is removed. Furthermore, pellicle 14 may be removed from photomask 12 without damaging photomask 12 since no residue is left on substrate 16 and only a small force is required to remove vacuum cup 70 from substrate 16. In one embodiment, vacuum cup 70 may be located at the four corners of frame 20 such that vacuum cup 70 contacts substrate 16 at the four corners of the mask field on photomask 12. In additional embodiments, a greater or lesser number of vacuum cups may be located at any appropriate positions on frame 20. Similar to the attachment mechanism described in reference to FIGS. 3, 4 and 5, vacuum cup 70 reduces the amount of stress on photomask 12 caused by pellicle 14 since pellicle 14 may slide on the surface of substrate 16.

Although the present invention has been described in detail, it should be understood that various changes, substitutions and alterations can be made thereto without departing from the sphere and scope of the invention as defined by the appended claims.

What is claimed is:

1. A method for attaching a pellicle to a photomask, comprising:
   providing a pellicle including a thin film coupled to a first surface of a frame, the frame including a non-distorting mechanism coupled to a second surface of the frame and located opposite the thin film; and
   coupling the pellicle to a photomask using the non-distorting mechanism, the non-distorting mechanism operable to reduce stress exerted on the photomask by the pellicle.

2. The method of claim 1, wherein coupling the pellicle to the photomask using the non-distorting mechanism comprises:
   mounting the frame on the photomask with an attachment mechanism; and
   creating a seal between the frame and the photomask with a sealing mechanism.

3. The method of claim 2, wherein the sealing mechanism comprises a gasket.

4. The method of claim 3, wherein the gasket comprises a fluoropolymer.

5. The method of claim 3, wherein the gasket comprises a polyphosphazene based material.

6. The method of claim 3, wherein the gasket comprises a silicon based gel material.

7. The method of claim 2, wherein mounting the frame on the photomask with an attachment mechanism comprises:
   attaching a magnet to the second surface of the frame;
   forming a magnetic section on the photomask; and coupling the magnet to the magnetic section.

8. The method of claim 2, wherein mounting the frame on the photomask with an attachment mechanism comprises:
   forming a slot in the second surface of the frame;
   attaching a pin to the photomask, the pin including a proximal end and a distal end;
   placing the distal end of the pin in the slot; and
   securing the pin in the slot by using a fastener associated with the frame.

9. The method of claim 2, wherein mounting the frame on the photomask with an attachment mechanism comprises:
   forming an attachment point on an outer perimeter of the frame;
   attaching a clip to the photomask, the clip including a proximal end and a distal end; and
   placing the distal end of the clip in the attachment point to secure the pellicle to the photomask.

10. The method of claim 2, wherein mounting the frame on the photomask with an attachment mechanism comprises:
    attaching a vacuum cup to the second end of the frame;
    placing the vacuum cup on the photomask; and
    applying a force on the pellicle to secure the pellicle to the photomask.

11. The method of claim 1, further comprising the non-distorting mechanism operable to reduce degradation of a flatness associated with the photomask.

12. A pellicle, comprising:
    a frame including a first surface located opposite of a second surface;
    a transparent film attached to the first surface of the frame; and
    a non-distorting mechanism coupled to the second surface of the frame, the non-distorting mechanism operable to couple the pellicle to a photomask and reduce stress exerted by the pellicle on the photomask.

13. The pellicle of claim 12, wherein the non-distorting mechanism comprises:
    an attachment mechanism operable to mount the frame on the photomask; and
    a sealing mechanism operable to create a seal between the pellicle and the photomask after the frame has been mounted on the photomask.

14. The pellicle of claim 13, wherein the sealing mechanism comprises a gasket.

15. The pellicle of claim 14, wherein the gasket comprises a fluoropolymer.

16. The pellicle of claim 14, wherein the gasket comprises a polyphosphazene based material.

17. The pellicle of claim 14, wherein the gasket comprises a silicon based gel material.

18. The pellicle of claim 13, wherein the attachment mechanism comprises a magnet operable to couple to a magnetic section formed on the photomask.

19. The pellicle of claim 13, wherein the attachment mechanism comprises:
    a slot formed in the frame;
    a pin including a proximal end and a distal end, the proximal end operable to couple to the photomask; and
    a fastener associated with the frame, the fastener operable to secure the distal end of the pin in the slot.

20. The pellicle of claim 13, wherein the attachment mechanism comprises:
    an attachment point formed along an outer perimeter of the frame; and
    a clip including a proximal end and a distal end, the proximal end operable to couple to the photomask and the distal end operable to engage the attachment point on the frame.

21. The pellicle of claim 13, wherein the attachment mechanism comprises a vacuum cup operable to couple to the photomask.

22. A photomask assembly, comprising:
    a photomask including a patterned layer formed on a portion of a substrate; and
    a pellicle coupled to the substrate by a non-distorting mechanism, the pellicle including a thin film attached to a frame opposite the non-distorting mechanism, the non-distorting mechanism operable to reduce stress exerted on the photomask by the pellicle.

23. The photomask assembly of claim 22, wherein the non-distorting mechanism comprises:

an attachment mechanism operable to mount the frame on the photomask; and a sealing mechanism operable to provide a seal between the pellicle and the photomask.

24. The photomask assembly of claim 23, wherein the sealing mechanism comprises a gasket.

25. The photomask assembly of claim 24, wherein the gasket comprises a fluoropolymer.

26. The photomask assembly of claim 24, wherein the gasket comprises a polyphosphazene based material.

27. The photomask assembly of claim 24, wherein the gasket comprises a silicon based gel material.

28. The photomask assembly of claim 23, wherein the attachment mechanism comprises a magnet operable to couple to a magnetic section formed on the photomask.

29. The photomask assembly of claim 23, wherein the attachment mechanism comprises:

a slot formed in the frame;

a pin including a proximal end and a distal end, the proximal end operable to couple to the photomask; and a fastener associated with the frame, the fastener operable to secure the distal end of the pin in the slot.

30. The photomask assembly of claim 23, wherein the attachment mechanism comprises:

an attachment point formed along an outer perimeter of the frame; and a proximal end and a distal end, the proximal end operable to couple to the photomask and the distal end operable to engage the attachment point on the frame.

31. The photomask assembly of claim 23, wherein the attachment mechanism comprises a vacuum cup operable to couple to the photomask.

32. The photomask assembly of claim 22, wherein the patterned layer comprises chrome with a reduced amount of intrinsic stress.

* * * * *